United States Patent
Sabry et al.

(10) Patent No.: US 9,793,478 B2
(45) Date of Patent: Oct. 17, 2017

(54) STRUCTURED SILICON-BASED THERMAL EMITTER

(71) Applicant: Si-Ware Systems, Cairo (EG)

(72) Inventors: Yasser M. Sabry, Nasr (EG); Diaa Khalil, Cairo (EG); Tarik E. Bourouina, Joinville (FR); Momen Anwar, Cairo (EG)

(73) Assignee: SI-WARE SYSTEMS, Cairo (EG)

( * ) Notice: Subject to any disclaimer, the term of this patent is extended or adjusted under 35 U.S.C. 154(b) by 0 days.

(21) Appl. No.: 15/203,773

(22) Filed: Jul. 6, 2016

(65) Prior Publication Data

US 2017/0012199 A1   Jan. 12, 2017

Related U.S. Application Data

(60) Provisional application No. 62/191,254, filed on Jul. 10, 2015.

(51) Int. Cl.
*H01L 49/00* (2006.01)
*G01J 3/02* (2006.01)
*G01J 3/10* (2006.01)
*G01J 3/26* (2006.01)
*G01J 3/42* (2006.01)
(Continued)

(52) U.S. Cl.
CPC ............ *H01L 49/00* (2013.01); *G01J 3/0205* (2013.01); *G01J 3/0208* (2013.01); *G01J 3/0216* (2013.01); *G01J 3/0237* (2013.01); *G01J 3/0245* (2013.01); *G01J 3/108* (2013.01); *G01J 3/26* (2013.01); *G01J 3/42* (2013.01); *H01K 1/04* (2013.01); *H01K 1/14* (2013.01)

(58) Field of Classification Search
CPC .......................................................... H01L 49/00
USPC .................................................... 250/504 R
See application file for complete search history.

(56) References Cited

U.S. PATENT DOCUMENTS

| | | | |
|---|---|---|---|
| 5,714,759 A * | 2/1998 | Nelson | G01J 3/02 250/339.02 |
| 7,504,702 B2 * | 3/2009 | Mazur | H01L 31/0236 257/461 |

(Continued)

FOREIGN PATENT DOCUMENTS

| DE | 102010045644 A1 | 3/2012 |
|---|---|---|
| EP | 0689229 | 12/1995 |

(Continued)

OTHER PUBLICATIONS

Luo et al. "Diamond and diamond-like carbon MEMS." J. Micromech. & Microeng. 17 S147-S163 (2007).

(Continued)

*Primary Examiner* — Phillip A Johnston
(74) *Attorney, Agent, or Firm* — Loza & Loza, LLP; Holly L. Rudnick

(57) ABSTRACT

An optical radiation source produced from a disordered semiconductor material, such as black silicon, is provided. The optical radiation source includes a semiconductor substrate, a disordered semiconductor structure etched in the semiconductor substrate and a heating element disposed proximal to the disordered semiconductor structure and configured to heat the disordered semiconductor structure to a temperature at which the disordered semiconductor structure emits thermal infrared radiation.

29 Claims, 14 Drawing Sheets

(51) Int. Cl.
H01K 1/04 (2006.01)
H01K 1/14 (2006.01)

(56) References Cited

U.S. PATENT DOCUMENTS

| | | | |
|---|---|---|---|
| 8,846,551 B2* | 9/2014 | Gupta | B23K 26/12 |
| | | | 216/65 |
| 2008/0112455 A1 | 5/2008 | Haskett | |
| 2009/0160314 A1 | 6/2009 | Zalyubovskiy et al. | |
| 2011/0121206 A1* | 5/2011 | Mazur | H01L 21/02532 |
| | | | 250/492.2 |
| 2014/0003777 A1 | 1/2014 | Sengupta | |
| 2014/0022618 A1 | 1/2014 | Sabry et al. | |

FOREIGN PATENT DOCUMENTS

| | | |
|---|---|---|
| EP | 0802562 A2 | 10/1997 |
| EP | 1705763 A2 | 9/2006 |
| EP | 2211141 | 7/2010 |
| KR | 10-2009-0004279 A | 1/2009 |
| WO | 02/080620 A1 | 10/2002 |
| WO | WO2013013678 | 7/2013 |

OTHER PUBLICATIONS

Roumanie et al., "Enhancing surface activity in silicon microreactors: use of black silicon and alumina as catalyst supports for chemical and biological applications." Chem Engr. Journal 135S, S317-S326 (2008).

Jadhav et al., "Experimental evaluation of natural convection heat transfer for rough surface." Int'l. J. of Latest Trends in Engineering and Tech (IJLTETP) vol. 5, Issue 2 (Mar. 2015).

Torres et al., "Femtosecond laser texturization for improvement of photovoltaic cells: black silicon." J. Optoelectronics & Advanced Materials, vol. 12, p. 621-625 (Mar. 2010).

Zhao et al., "19.8% efficient 'honeycomb' textured multicrystalline and 24.4% monocrystalline silicon solar cells." Appl. Physics Letters, vol. 73:14 (Oct. 5, 1998).

Huang et al., "Improved broadband and quasi-omnidirectional antireflection properties with biomimetic silicon nanostructures." Letters, Nature Nanotechnology, vol. 2 (Dec. 2007).

Cardoso et al., "Laser microstructuring for fabricating superhydrophobic polymeric surfaces." Applied Surface Science 257, 3281-3284 (2011).

Serpenguzel et al., "Luminescence of black silicon." J. Nanophotonics, vol. 2, 021770 (Feb. 21, 2008).

Huang et al., "Metal-assisted chemical etching of silicon: a review." Advanced Materials, 23, 285-308 (2011).

Zhang et al., "Microstructuring of p-Si(100) by localized electrochemical polishing using patterned agarose as a stamp." Electrochemistry Communications 9, 2529-2533 (2007).

Her et al. "Microstructuring of silicon with femtosecond laser pulses." Applied Physics Letters 73, 1673 (1998).

Biswas et al., "Nano-crystalline silicon solar cell architecture with absorption at the classical 4n2 limit." Optics Express vol. 19:S4 (Jul. 4, 2011).

Wu et al., "Near-unity below-band-gap absorption by microstructured silicon." Applied Physics Letters 78, 1850 (2001).

Huang et al., "Origin and tuning of surface optic and long wavelength phonons in biomimetic GaAs nanotip arrays." Optical Materials Express 535, vol. 1, No. 4 (Aug. 1, 2011).

Yeng et al., "Photonic crystal enhanced silicon cell based thermophotovoltaic systems." Optics Express A157, vol. 23, No. 3 (Feb. 9, 2015).

Nohira et al., "Pinpoint and bulk electrochemical reduction of insulating silicon dioxide to silicon." Nature Materials, vol. 2 (Jun. 2003).

Smith et al., "Porous silicon formation mechanisms." J. Applied Physics 71, R1 (1992).

Steglich et al., Self-organized, effective medium black silicon for infrared antireflection. Infrared Physics & Technology (Mar. 2015).

Tsujino et al., Texturization of multicrystalline silicon wafers for solar cells by chemical treatment using metallic catalyst. Solar Energy Mat. & Solar Cells 90, 100-110 (2006).

Jansen et al., "The black silicon method: a universal method for determining the pareameter setting of a fluorine-based reactive ion etcher in deep silicon trench etching with profile control." Journal Micromech. Microeng. 5, 115-120 (1995).

Hoyer et al., "Terahertz emission from black silicon." Applied Physics Letters 93, 091106 (2008).

Bassett et al., "Study of black silicon obtained by deep reactive ion etching—approach to achieving the hot spot of a thermoelectric energy harvester." Microsyst. Technol 18:1807-1814 (2012).

Ivanova et al., "Bactericidal activity of black silicon." Nature Communications (Nov. 26, 2013).

Stubenrauch et al., "Bonding of silicon with filled and unfilled polymers based on black silicon." Micro & Nano Letters 2, (1), p. 6-8 (2007).

Yang et al., "Cathodic potential dependence of electrochemical Reduction of SiO2 granules in molten CaCl2." Metallurgical and Materials Transactions, vol. 3E (Sep. 2016).

Crouch et al., "Comparison of structure and properties of femtosecond and nanosecond laser structure silicon." Applied Physics Letters 84, 1850 (2004).

Lu et al., "Composite structure of SiO2@AgNPs@p-SiNWs for enhanced broadband optical antireflection."

PCT/US2016/041357. Applicant: Si-Ware Systems. International Search Report-Written Opinion, dated (Mar. 20, 2017).

Axetris. "Infrared sources for gas detection and monitoring." (Downloaded Jul. 2016).

Baumann, et al. "Tailoring the absorption properties of black silicon." Energy Procedia 27, 480-484, Leuven, Belgium (Apr. 2-5, 2012).

Konz, et al. "Micromachined IR-source with excellent blackbody like behavior." Proc. SPIE 5836, Smart Sensors, Actuators, and Mems II, 540 (Jul. 1, 2005).

Müller, et al., "Infrared emitting nanostructures for highly efficient microhotplates." J. Micromech. Microeng. 24 (2014).

Yuasa, et al. "Single crystal silicon micromachined pulsed infrared light source." Transducers '97. Int'l Conf. on Solid-State Sensors and Actuators, Chicago, Illinois (Jun. 16-19, 1997).

Invitation to Pay Additional Fees for PCT/US16/41357 dated Nov. 2, 2016; 9 pages.

Hildenbrand et al, "Fast transient temperature operating micromachined emitter for mid-infrared optical gas sensing systems: design, fabrication, characterization and optimization", Microsystem Technologies (2010) 16:745-754; DOI 10.100/s00542-010-1049-1.

Anwar et al, "Black silicon-based infrared radiation source", Optical Sensing II, SPIE, vol. 9752, Mar. 14, 2016, pp. 97520E-97520E, XP060067714, DOI: 10.1117/12.2211668.

PCTUS2016041357. Written Opinion. (dated Aug. 28, 2017).

* cited by examiner

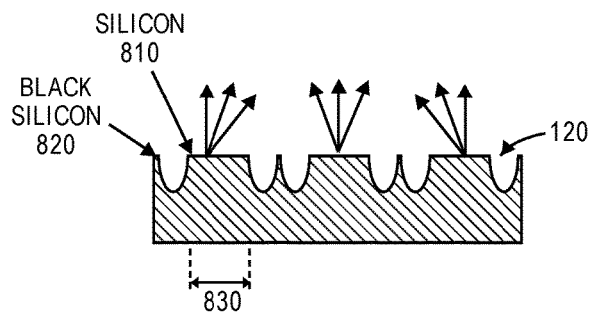
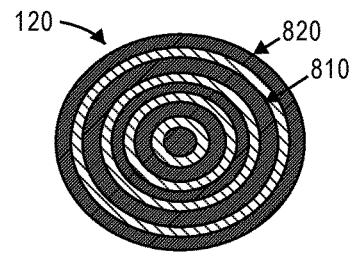
FIG. 8A  FIG. 8B
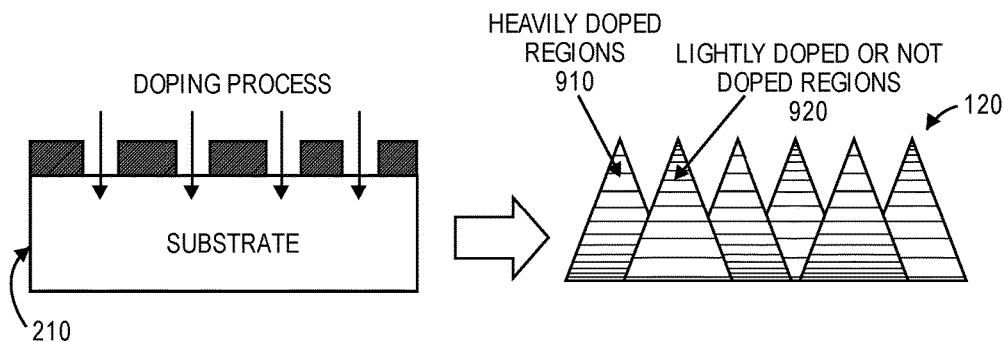
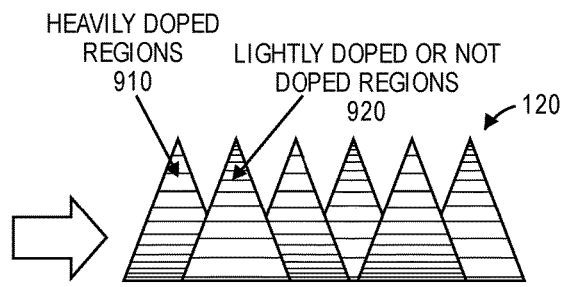
FIG. 9A  FIG. 9B
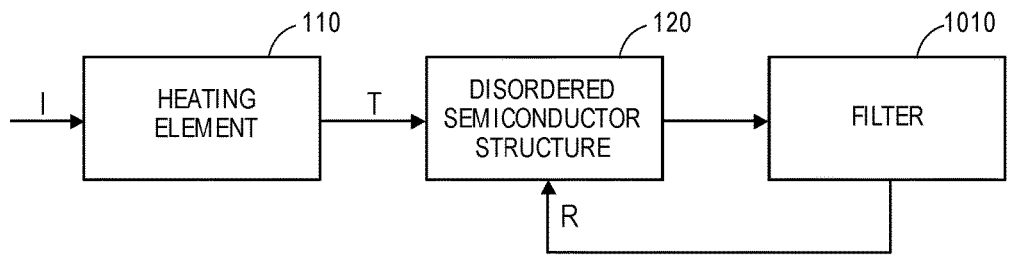
FIG. 10

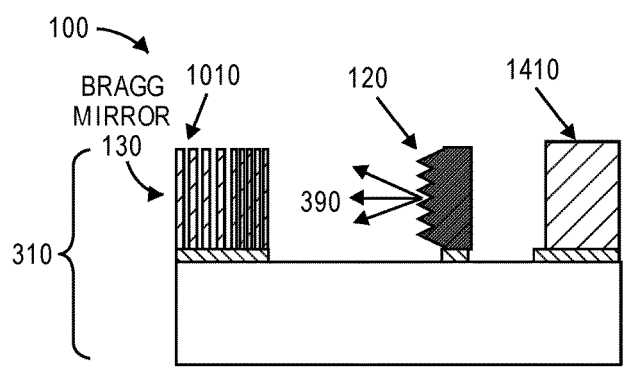 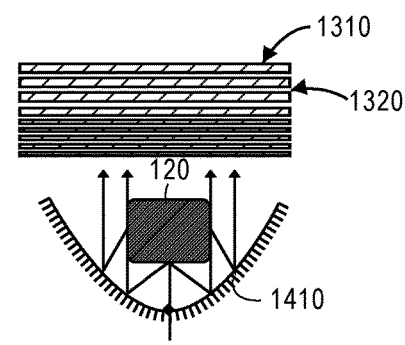
FIG. 14A  FIG. 14B
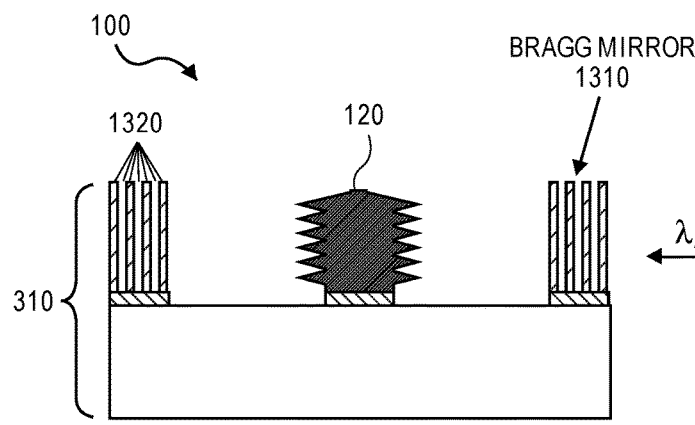 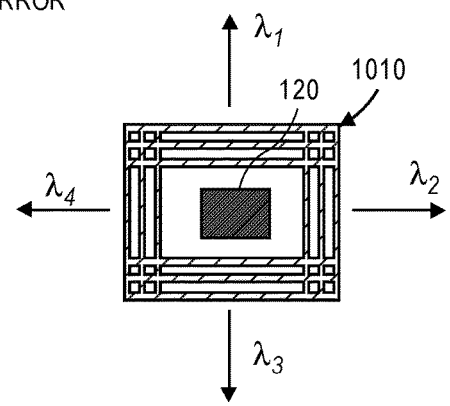
FIG. 15A  FIG. 15B

STRUCTURED SILICON-BASED THERMAL EMITTER

CROSS REFERENCE TO RELATED PATENTS

The present U.S. Utility Patent Application claims priority pursuant to 35 U.S.C. §119(e) to the following U.S. Provisional Patent Application(s) which are hereby incorporated herein by reference in their entirety and made part of the present U.S. Utility Patent Application for all purposes:

1. U.S. Provisional Application Ser. No. 62/191,254, entitled "Structured Silicon-Based Thermal Emitter," filed Jul. 10, 2015.

BACKGROUND OF THE INVENTION

Technical Field of the Invention

Aspects of the present disclosure relate in general to optical radiation sources, and in particular to silicon-based thermal emitters.

Description of Related Art

Conventional thermal light sources utilize thermal emitters that generate photons by heating emitting material. Such thermal emitters are typically broadband radiators whose output spectral radiance is a function of the wavelength, the absolute temperature of the heated material and the emissivity of the element, all of which are governed by Planck's Law. The ideal source of continuous near- to mid-infrared (NIR) radiation is a high-temperature blackbody. The spectral brightness $U_\lambda$ (e.g., the power flow per unit area per wavelength per steradian at wavelength $\lambda$) from a blackbody source at temperature T is given by Planck's equation (in W/mm². µm.sr):

$$U_\lambda(\lambda, T) = \frac{C_1}{\lambda^5 [\exp(C_2/\lambda T) - 1]}, \quad \text{(Equation 1)}$$

where $C_1=11.9$ (W. µm⁴/mm².sr) in a vacuum, $C_2=14390$ µm.K, T is the absolute temperature of the radiating body, and $\lambda$ is the wavelength. Thus, according to Planck's equation, for any particular wavelength range, the emitted radiance increases with temperature.

The blackbody is the perfect emitter and absorber of radiation, and it also radiates uniformly in all directions per unit area normal to the direction of emission. However, for practical non-ideal sources, the radiation properties are less than that of a blackbody. Therefore, the emissivity of a surface ($0 \leq \epsilon \leq 1$) may be represented as the ratio of the radiation emitted by the surface to the radiation emitted by a blackbody at the same temperature, and the emissivity may vary with temperature, wavelength and direction of the emitted radiation.

When a radiation flux is incident on a surface, the incident radiation flux is commonly referred to as irradiation, and at the surface, part of the irradiation is absorbed, part is reflected and the remaining is transmitted. The absorptivity $\alpha$ is the fraction of irradiation absorbed by the surface. Kirchhoff's law states that the total emissivity of a surface at temperature T is equal to its total absorptivity of radiation from a blackbody at the same temperature.

Most of the thermal radiation products currently available are based on filament incandescent sources that approximate a blackbody with a special glass bulb for use in the low NIR or NIR spectral range. Their operating temperatures can reach up to 2000-3000 K, due to the glass and the inert gas inside the bulb. The spectral radiation of these filaments can extend up to 4 µm, as the glass absorbs wavelengths beyond this limit. However, the package geometry of such glass-bulb based filament incandescent sources may be problematic for some applications.

Filament incandescent sources without a glass bulb are also available for some applications. Operating in an open environment, their temperature is usually limited to 600-900 K, leading to low emitted power for a given filament surface area. To increase the temperature, the filament can be hermetically sealed with a transparent window in the desired wavelength range. For example, a Calcium Fluoride window may be used for wavelengths up to 8 µm. However, such incandescent sources are not compatible with device miniaturization and batch fabrication in photonics applications.

Microelectromechanical system (MEMS) silicon technology is a rich platform for the integration of electrical, mechanical and optical systems on a chip. Single-crystal silicon material has excellent purity and well-established optical properties, which include good surface quality and transparency over a wide spectral range in the infrared range. Furthermore, silicon has excellent thermal, mechanical and thermo-elastic properties. Moreover, there is great flexibility in the design and manufacture of silicon devices, taking advantage of well-established microfabrication technologies.

Therefore, thermal sources formed from planar silicon structures have been developed for the mid-infrared. These sources usually consist of thin film structures fabricated onto a silicon substrate. A resistive heating element may be integrated on the silicon substrate to heat the emission area. These MEMS thermal sources have low electrical power consumption due to their low thermal mass as a result of the substrate being made very thin.

MEMS sources may further be optimized to provide good emissivity across a large wavelength range by increasing the surface roughness. For example, black platinum or black silver may be deposited on the surface of a silicon emitter to increase the surface roughness. As another example, photonic crystal deep cavities of silicon may be fabricated on the silicon substrate to increase the surface roughness. Such a periodic structure may be obtained by photolithography followed by electrochemical etching and oxidation to form stable cavities of porous silicon. However, the spectral response of the emissivity can significantly vary with the pore size and the periodicity of the cavities can result in sharp dip lines in the emissivity. In addition, the emission covers a broad wavelength range that may not be usable in all applications, and thus, may represent a deficiency. Therefore, what is needed is a miniaturized tunable thermal emitter that maximizes the surface area and emissivity over a wide emission band.

SUMMARY OF THE INVENTION

Various aspects of the present disclosure provide an optical radiation source produced from disordered semiconductor material, such as black silicon. The optical radiation source includes a semiconductor substrate, a disordered semiconductor structure etched in the semiconductor substrate, and a heating element disposed proximal to the disordered semiconductor structure and configured to heat the disordered semiconductor structure to a temperature at which the disordered semiconductor structure emits thermal infrared radiation.

BRIEF DESCRIPTION OF THE DRAWINGS

A more complete understanding of the present disclosure may be obtained by reference to the following detailed description when taken in conjunction with the accompanying drawings wherein:

FIGS. 8A and 8B are schematic diagrams illustrating another exemplary configuration of the disordered semiconductor structure for controlling the directionality of the thermal infrared radiation, in accordance with embodiments of the present disclosure;

FIGS. 9A and 9B are schematic diagrams illustrating another exemplary configuration of the disordered semiconductor structure for controlling the directionality of the thermal infrared radiation, in accordance with embodiments of the present disclosure;

FIG. 10 is a block diagram illustrating exemplary components of an optical radiation source including a filter for controlling the thermal emission spectrum, in accordance with embodiments of the present disclosure;

FIGS. 14A and 14B are schematic diagrams illustrating an exemplary configuration of the optical radiation source including a Bragg mirror filter, in accordance with embodiments of the present disclosure;

FIGS. 15A and 15B are schematic diagrams illustrating another exemplary configuration of the optical radiation source including a Bragg mirror filter, in accordance with embodiments of the present disclosure;

DETAILED DESCRIPTION OF THE DRAWINGS

In accordance with embodiments of the present disclosure, an optical radiation source is formed using a disordered semiconductor structure for generating thermal infrared radiation based on heating of the disordered semiconductor structure. The disordered semiconductor structure may include, for example, structured silicon, commonly referred to as black silicon. The use of a disordered semiconductor structure maximizes the surface area and the emissivity over a wide emission band. The shape of the disordered semiconductor region may be controlled using a lithographic process, while the detailed microstructure may be controlled using a mask-less silicon etching process. For example, the disordered semiconductor fine structures (e.g., black silicon needles) may be oriented out-of-plane with respect to the substrate for the generation of light propagating mainly perpendicular to the substrate with a certain angle spectrum or in-plane for the generation of light propagating mainly parallel to the substrate with a certain angle spectrum. In addition, the optical radiation source may further include various optical components to focus and/or collimate the source output light.

The spectral emission of the disordered semiconductor structure may further be engineered by one or more optical filters and feedback mechanisms to utilize the out-of-interest-band emission for heating the structure. For example, optical filters may be formed using multi-layer Bragg reflectors having either an in-plane or out-of-plane orientation. The thermal mass of the disordered semiconductor structure may further be minimized by reducing the thickness of the layer over which the disordered semiconductor structure is formed. The disordered semiconductor region may further be thermally insulated on top of an insulating membrane, such as a buried oxide (BOX) layer, a glass wafer or nitride layer. Such thermal insulation may facilitate heating of the disordered semiconductor material with minimum energy, which provides improved efficiency for the resulting light source.

Figure 1:
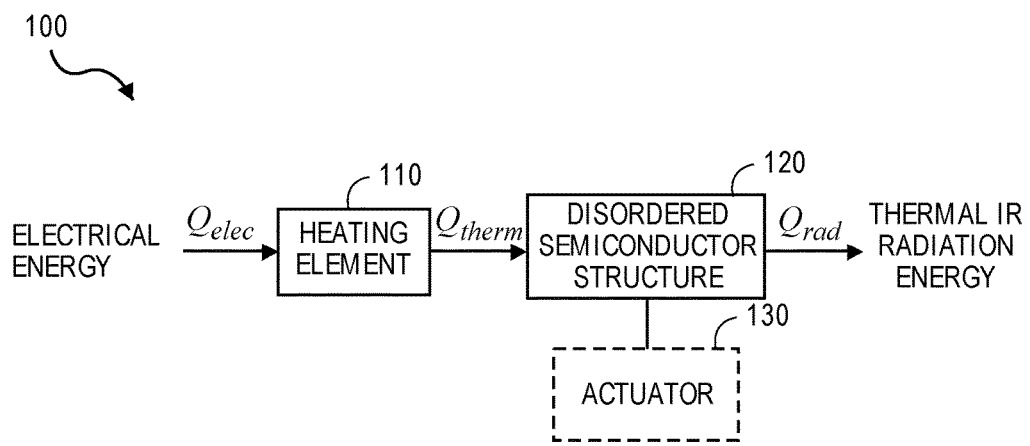
FIG. 1 is a block diagram illustrating exemplary components of an optical radiation source, in accordance with embodiments of the present disclosure.

FIG. 1 is a block diagram illustrating exemplary components of an optical radiation source 100 produced from disordered semiconductor material, in accordance with embodiments of the present disclosure. The optical radiation source 100 includes a heating element 110 and a disordered semiconductor structure 120. In some examples, the disordered semiconductor structure 120 includes black silicon.

The heating element 110 of the optical radiation source 100 accepts electrical energy input in the form of electrical current I and voltage V. Thus, the input electrical power P is equal to the multiplication of I and V. The integration of the input power over certain period of time gives the total electrical energy $Q_{elec}$ supplied to the optical radiation source 100 in this period.

The heating element 110 transforms the input electrical energy into thermal energy $Q_{therm}$, which is utilized to heat the disordered semiconductor structure 120 to a temperature at which the disordered semiconductor structure transforms the thermal energy into radiation energy $Q_{rad}$ and emits thermal infrared (IR) radiation (light). For example, the temperature may be less than 1400 degrees Celsius (C), but preferably between 450 and 1200 degrees C. At higher temperatures, the optical radiation source 100 may be packaged under vacuum or an inert gas environment to prevent oxidation of the semiconductor material. To facilitate efficient heating of the disordered semiconductor structure 120 with minimal loss of energy, the heating element 110 is in close proximity and in good thermal contact with the disordered semiconductor structure 120. In some examples, the heating element includes a metal, such as platinum.

The dimensions (in terms of height, width and roughness) of the fine structures of the disordered semiconductor structure 120 may be selected such that the absorptivity, and thus emissivity, of the disordered semiconductor structure 120 is much higher than normal (ordered) silicon structures. As such, the emission properties of the disordered semiconductor structure 120 may be improved in comparison to normal indirect-bandgap silicon, which may improve the efficiency of the optical radiation source 100 in terms of electrical to radiation energy conversion. In some examples, the disordered semiconductor structure emits thermal infrared (IR) radiation energy over a wideband spectrum, depending on the operating conditions.

The optical radiation source 100 may further include an actuator 130 coupled to the disordered semiconductor structure 120. In some examples, the actuator 130 may include a microelectromechanical system (MEMS) actuator, which is configured to cause a displacement (e.g., movement) of the disordered semiconductor structure 120 to direct the emitted IR radiation (light) and/or control the wavelength of the light. In an exemplary embodiment, the MEMS actuator may be an electrostatic actuator, such as a comb drive actuator, parallel plate actuator or other type of actuator.

Figure 2:
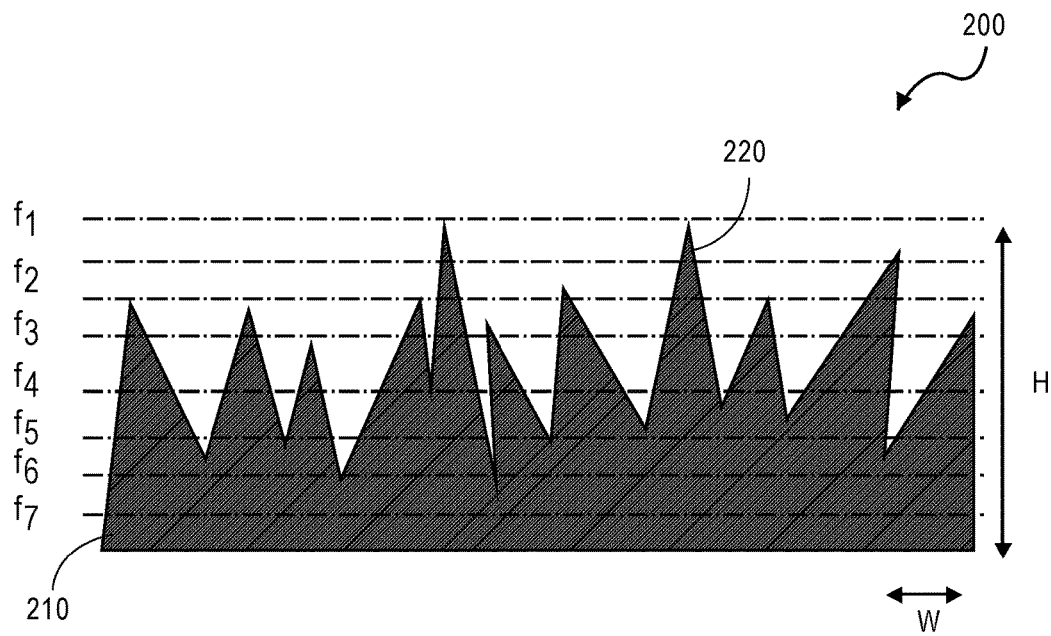
FIG. 2 is a schematic diagram illustrating an exemplary configuration of a black silicon structure, in accordance with embodiments of the present disclosure.

FIG. 2 is a schematic diagram illustrating an exemplary configuration of a black silicon structure 200 fabricated by etching a semiconductor (silicon) substrate 210, in accordance with embodiments of the present disclosure. In some examples, the disordered semiconductor structure 120 shown in FIG. 1 includes the black silicon structure 200 shown in FIG. 2. The black silicon structure 200 is a needle-shaped surface structure, in which the surface of the semiconductor substrate 210 includes a plurality of needles 220 made of single-crystal silicon. In some examples, the needle diameters may be smaller than 1 micrometer and the needle heights may be larger than 10 micrometers, with a random variation of these parameters across the black silicon area. The needles may be formed in various shapes, such as spikes, columns, cones and pyramids, by etching without the use of a photolithographic mask.

Thus, as shown in FIG. 2, the black silicon structure 200 is a disordered semiconductor structure with random height and period. The aspect ratio (AR) of the black silicon structure 200 may be defined as:

$$AR = \frac{H}{W}, \qquad \text{(Equation 2)}$$

where H is the average height and W is the average width, both of which may be controlled by process parameters, such as etching time, bias voltage and temperature. In some examples, the aspect ratio needed for emitter functionality is $AR \geq 5$.

The fill factor $f_1, f_2 \ldots f_N$ of the black silicon structure 200 may further be defined as the ratio between silicon and air for a certain cross section plane of the structure 200. As shown in FIG. 2, the structure has a gradual change in the fill factor, such that the fill factor increases with the depth. For example, the fill factor of the black silicon structure 200 may gradually increase from the head to the base of the needles. The needle-shaped surface structure further provides a continuous change of the effective refractive index that reduces Fresnel reflection. As the density-grade depth increases, reflectance decreases exponentially with a characteristic grade depth of about ⅛ the vacuum wavelength or half the wavelength in silicon (Si).

Typically, the black silicon structure 200 is fabricated on the top of a silicon substrate such that the progress of the etching is out-of-plane with respect to the silicon substrate. The black silicon structure 200 may be fabricated using any of a number of different etching techniques. The various techniques may be categorized into wet etching techniques and dry etching techniques. The wet etching techniques include, for example, HF etching and stain etching, in addition to recent etching methods including metal-assisted chemical etching and the Fray-Farthing-Chen-Cambridge (FFC-Cambridge) processes. The dry etching techniques include, for example, reactive ion etching (RIE) and laser irradiation etching.

In electrochemical HF etching of silicon, a silicon wafer is connected to the anode of an electrochemical cell immersed into a solution containing HF, $H_2O$ and ethanol responsible for removing silicon oxide produced during the etching reaction, participating in the oxidation reaction and reducing silicon surface tension, respectively. In the low current density region, the etching reaction is limited by the oxidation process, leading to the formation of porous silicon, where the pore sizes increase as the current density rises and the depth propagates as etching time increases. Although electrochemical HF etching is attractive due to its low cost process, maintaining a uniform current density over a large surface area may be challenging.

Stain etching employs HF and $HNO_3$ to perform chemical etching of silicon, leading to the formation of porous silicon. The etching action is based on successive oxidation-dissolution processes. By controlling the relative concentrations of acids, different silicon surface morphologies can be formed. Stain etching is effective in the low $HNO_3$ concentration region, and by controlling the concentration and the etching time, the effective refractive index of the porous layer may be adjusted.

In metal-assisted chemical etching, silicon is etched in the presence of HF and an oxidative agent is catalyzed by noble metals to form nanostructured surfaces with various morphologies. Once the required surface structure is created, the residual metal nanoparticles are cleaned off. Smooth transition of porosity or the effective refractive index is obtained by controlling the concentration of the metal nanoparticles or using reactive ion etching retouch the nanostructures produced by metal assisted chemical etching.

Porous black silicon may also be fabricated via the FFC-Cambridge process, in which $SiO_2$ is electrochemically reduced to porous silicon at high temperature such as 850° C. [Error! Reference source not found.]. The FFC-Cambridge process is cheap and simple, but the high temperature process may render the silicon wafer prone to metal contaminations.

Reactive ion etching (RIE) at cryogenic temperatures may also be used to form silicon grass black silicon surfaces. Gas composition of $SF_6$ and $O_2$ generates F* and O* radicals responsible for etching silicon and forming a passivation layer on a cooled silicon substrate, respectively, where the passivation layer is partly removed by ion bombardment. Random silicon microstructures with very high aspect ratios may be formed due to this etching/passivation mechanism. The RIE process parameters, including the gas flow rate, substrate bias and temperature, controls the morphology of the formed black silicon. In high density plasma systems, etch and passivation rates may be boosted and high aspect ratio black silicon may be formed. Other gases may also be used also to perform the same function.

The black silicon structure 200 may be also fabricated by shining very short and intense laser pulses at a silicon surface in a gas environment. For example, in air, the silicon surface may react with air, thus etching some of the surface and leaving a pattern of conical spikes. An x-y translation stage may be used to scan the silicon wafer surface with the focused laser beam. Black silicon may also be produced by irradiating silicon with femtosecond laser pulses in the presence of a gas containing sulfur hexafluoride and other dopants. The surface of the silicon may then develop a self-organized microscopic structure of micrometer-sized cones. Similar surface modification can be achieved in vacuum, but the individual silicon cones may lack sharp tips.

The black silicon structure 200 may also be fabricated using femto second laser pulses focused on the semiconductor substrate 210 in an environment filled with heavy chalocgens (e.g., S, Se, or Te) to dope a thin layer of silicon at the surface of the semiconductor substrate to non-equilibrium levels. This optical hyperdoping process introduces levels in the bandgap that improves the emissivity of the black silicon structure 200 for longer wavelengths.

Figure 3A:
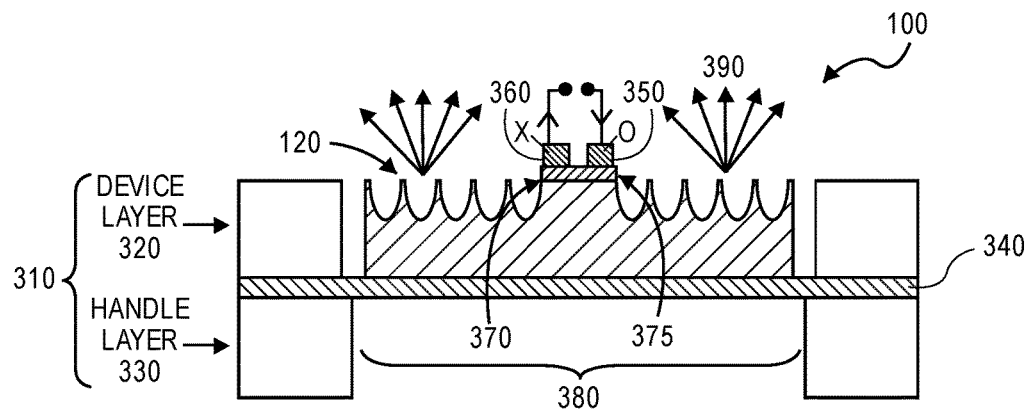
FIGS. 3A-3C are schematic diagrams illustrating exemplary configurations of the components of an optical radiation source, in accordance with embodiments of the present disclosure.
Figure 3B:
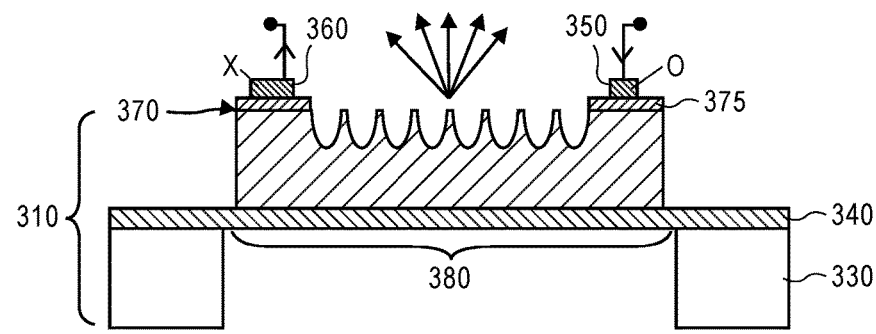
Figure 3C:
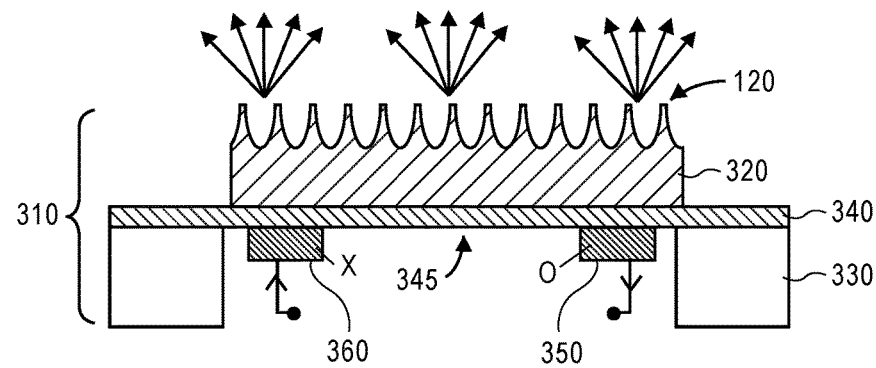

FIGS. 3A-3C are schematic diagrams illustrating exemplary configurations of the components of an optical radiation source 100, in accordance with embodiments of the present disclosure. In FIGS. 3A-3C, the optical radiation source 100 includes a disordered semiconductor structure 120 (e.g., the black silicon structure 200 shown in FIG. 2) fabricated on a semiconductor substrate 310, which may correspond to, for example, the semiconductor substrate 210 illustrated in FIG. 2. In the example shown in FIGS. 3A-3C, the semiconductor substrate 310 is a silicon-on-insulator (SOI) wafer that includes a device layer 320, a handle layer 330 and an insulator layer 340 disposed between the device layer 320 and the handle layer 330. In some examples, the insulator layer 340 may be a buried oxide (BOX) layer, a glass substrate/wafer or a nitride layer. The disordered semiconductor structure 120 may be fabricated by etching the device layer 320 or the handle layer 330, the former being illustrated in FIGS. 3A-3C.

The optical radiation source 100 further includes a heating element 110 formed of heating components 350 and 360 that are disposed on the SOI wafer 310 and coupled to electrical pads for current injection. Thus, as shown in FIGS. 3A-3C, the heating element 110 and disordered semiconductor structure 120 may be integrated on the same chip (semiconductor substrate). In the example shown in FIG. 3A, the heating element components 350 and 360 are disposed on top of the disordered semiconductor structure 120. For example, the heating element components 350 and 360 may be disposed on an un-etched surface 370 of the semiconductor substrate 310 within the disordered semiconductor area. In the example shown in FIG. 3B, the heating element components 350 and 360 are disposed on either side of the disordered semiconductor structure 120 on the un-etched surface 370 of the semiconductor substrate 310. In both FIGS. 3A and 3B, an insulator material 375 may be deposited on the un-etched surface 370 under the heating element components 350 and 360.

In the example shown in FIG. 3C, the heating element components 350 and 360 are disposed under the disordered semiconductor structure 120 on an exposed surface 345 of the insulator layer 340. For example, the disordered semiconductor structure 120 may be etched in the device layer 320 of the SOI wafer 310 and the handle layer 330 may further be etched to expose a portion of the surface of the insulator layer 340 vertically aligned with the disordered semiconductor structure 120. The heating element components 350 and 360 may then be mounted on the exposed surface 345 of the insulator layer 340. In some examples, the exposed surface 345 has a width equal to or greater than the width of the disordered semiconductor structure 120.

The thermal mass of the disordered semiconductor structure 120, which may be defined as the ability of the disordered semiconductor material to absorb and store heat energy, may be optimized by etching the semiconductor material (e.g., silicon) surrounding the disordered semiconductor material. For example, the device layer 320 may be etched on either side of the disordered semiconductor structure 120 and the handle layer 330 vertically underneath the disordered semiconductor structure 120 may also be etched such that the disordered semiconductor structure 120 is located on a membrane 380 of the insulator layer 340. In some examples, as shown in FIG. 3C, the exposed surface 345 of the insulator layer 340 on which the heating element components 350 and 360 are formed corresponds to the membrane 380 of the insulator layer 340. The membrane 380 thus acts as a thermal insulator to thermally insulate the disordered semiconductor structure 120. As indicated above, the insulator layer 340, and thus the membrane 380 may include a BOX layer, a glass substrate/wafer or a nitride layer.

In addition, the insulator layer 340 between the device layer 320 and the handle layer 330 may further be etched to release the disordered semiconductor structure 120. Moreover, the released disordered semiconductor structure 120 may be rendered movable by attaching the disordered semiconductor structure 120 to a MEMS actuator. Furthermore, the plane on which the disordered semiconductor structure 120 exists may be flat or curved to control the phase front of the emitted light.

Figure 4A:
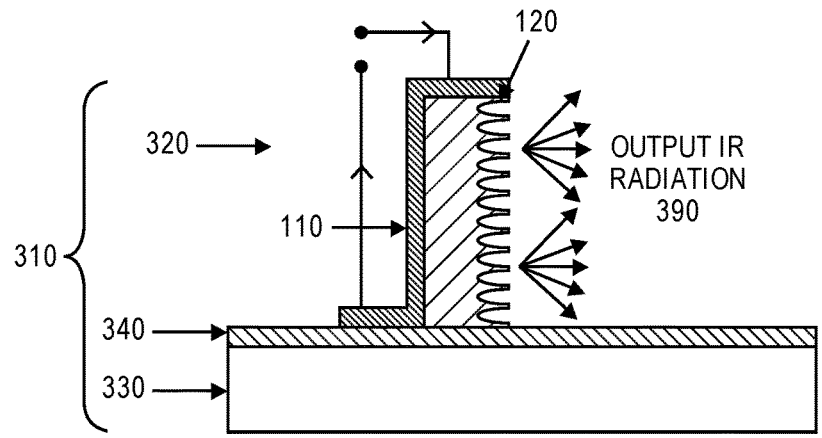
FIGS. 4A-4C are schematic diagrams illustrating another exemplary configuration of components of the optical radiation source, in accordance with embodiments of the present disclosure.
Figure 4B:
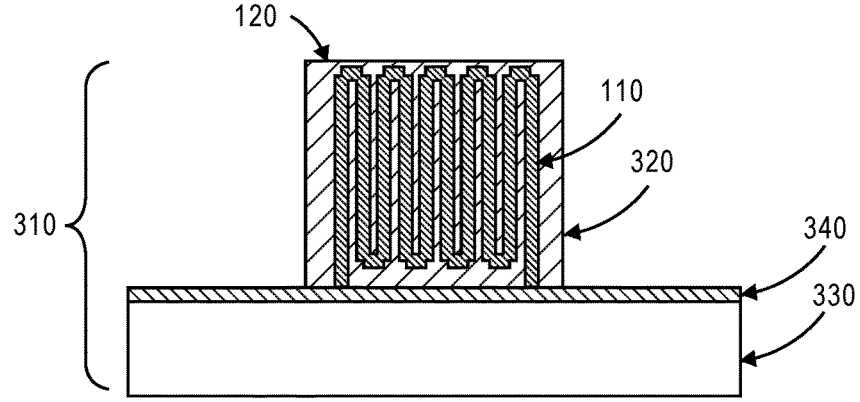
Figure 4C:
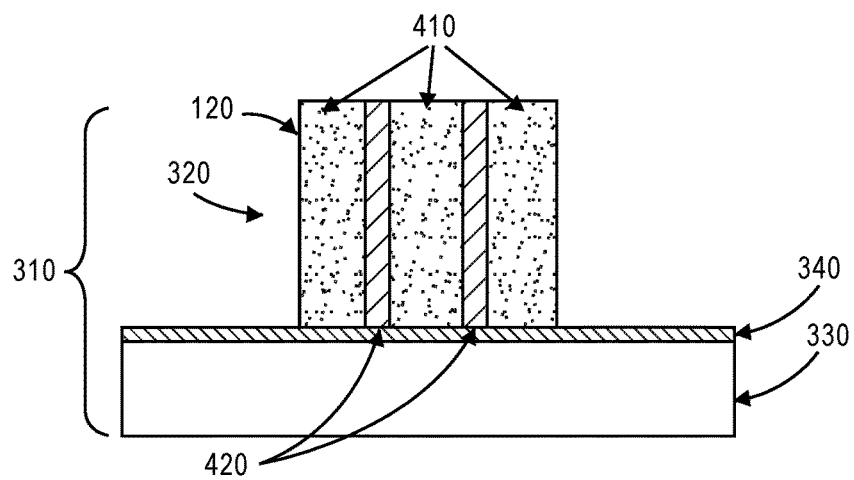

In each of the examples shown in FIGS. 3A-3C, the emitted infrared radiation (light) 390 has an angular spectrum around the out-of-plane direction with respect to the semiconductor substrate 310. In other examples, as shown in FIGS. 4A-4C, the emitted infrared radiation 390 may have an angular spectrum around the in-plane direction with respect to the semiconductor substrate 310. In the example shown in FIGS. 4A-4C, the disordered semiconductor structure 120 may be fabricated by etching the device layer 320 using, for example, a Deep Reactive Ion Etching (DRIE) Bosch process to form a high aspect ratio trench in the device layer 320 and then removing or etching the surrounding semiconductor material in the device layer 320 that are within the optical path of the optical radiation source 100.

In addition, the heating element 110 may be integrated with the disordered semiconductor structure 120. For example, as shown in FIG. 4B, the heating element 110 may be placed on a back side of the disordered semiconductor structure 120. Thus, the disordered semiconductor structure 120 may have a first side on which the plurality of needles are formed and a second side opposite the first side on which the heating element 110 may be formed, where the first and second sides are perpendicular to the plane of the semiconductor substrate 310. The heating element 110 may further extend over a top surface of the disordered semiconductor structure 120 (e.g., a top surface of the device layer 320). In some examples, the heating element 110 may be adhered or attached to the disordered semiconductor structure 120. In other examples, the heating element 110 may be fabricated by a lithography and deposition process.

In some examples, as shown in FIG. 4C, the disordered semiconductor structure 120 may include an array of emitters 410, each including a disordered semiconductor area (e.g., black silicon area). Each of the emitters 410 may be fabricated using, for example, a DRIE Bosch process to form a plurality of trenches with walls of disordered semiconductor material and then removing (e.g., etching) the semiconductor material surrounding the disordered semiconductor structure 120 in the optical path such that each of the emitters 410 is separated by a column of normal semiconductor material (e.g., silicon) 420. In some examples, a single heating element 110 may be used to heat all of the emitters 410. In other examples, one or more of the emitters 410 may be separately heated by an individual/respective heating element 110.

Although not shown, the thermal mass of the disordered semiconductor structure 120 may be optimized by etching the handle layer 330 underneath the disordered semiconductor structure 120 (as shown in FIGS. 3A-3C). In addition, the sacrificial (insulator) layer 340 between the device layer 320 and the handle layer 330 may further be etched to release the disordered semiconductor structure 120. Moreover, the released disordered semiconductor structure 120 may be rendered movable by attaching the disordered semiconductor structure 120 to a MEMS actuator. Furthermore, the plane on which the disordered semiconductor structure 120 exists may be flat or curved to control the phase front of the emitted light.

Figure 5A:
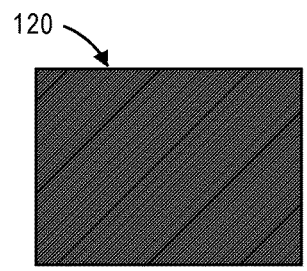
FIGS. 5A-5E are schematic diagrams illustrating exemplary shapes of the disordered semiconductor structure and heater element of the optical radiation source, in accordance with embodiments of the present disclosure.
Figure 5B:
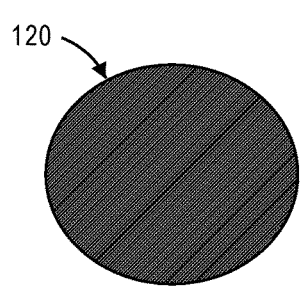
Figure 5C:
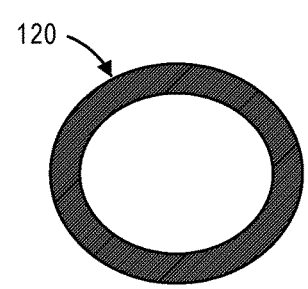

FIGS. 5A-5E are schematic diagrams illustrating exemplary shapes of the disordered semiconductor structure 120 and heater element 110 of the optical radiation source, in accordance with embodiments of the present disclosure. The shape of the disordered semiconductor area may be defined by lithographic technique and subsequent etching. Various shapes can be achieved, for example, square, circle or annular, as shown in FIGS. 5A-5C. In some examples, the shape may be optimized for the application in which the optical radiation source may be used.

Figure 5D:
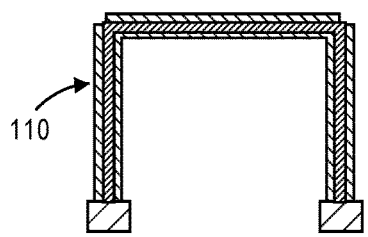
Figure 5E:
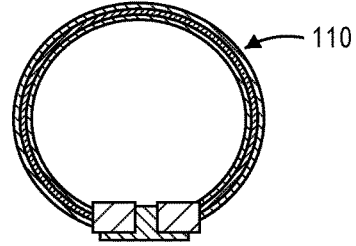

Further, as shown in FIGS. 5D and 5E, the shape of the heating element 110 may be selected based on the shape of the disordered semiconductor structure 120. In some examples, the heating element 110 may be defined by lithographic techniques and subsequent deposition of the thin films. Efficient heating of the disordered semiconductor structure 120 may result from optimizing the heater geometry and by thermal isolation of the disordered semiconductor structure 120 and/or the overall device.

FIG. 6A-6F are schematic diagrams illustrating exemplary configurations of the optical radiation source 100 including various optical components for directing the thermal infrared radiation, in accordance with embodiments of the present disclosure. In some examples, by using MEMS technology, the components of the optical radiation source 100 may be integrated monolithically. Thus, the alignment of the various integrated optical components with the disordered semiconductor structure may be implemented in a lithographic manner.

Figure 6A:
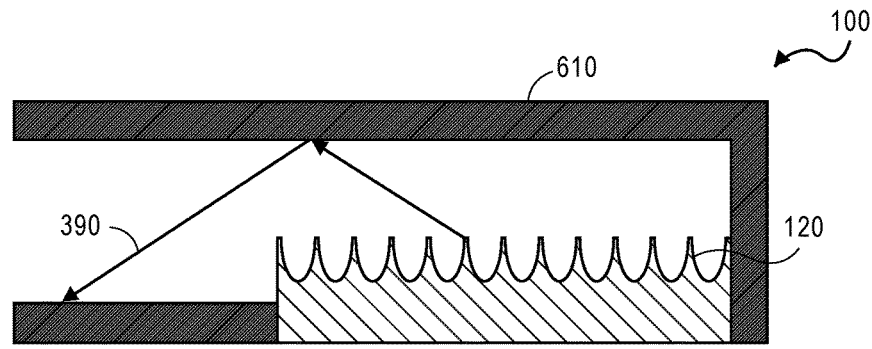
FIG. 6A-6F are schematic diagrams illustrating exemplary configurations of the optical radiation source including optical components for directing the thermal infrared radiation, in accordance with embodiments of the present disclosure.
Figure 6B:
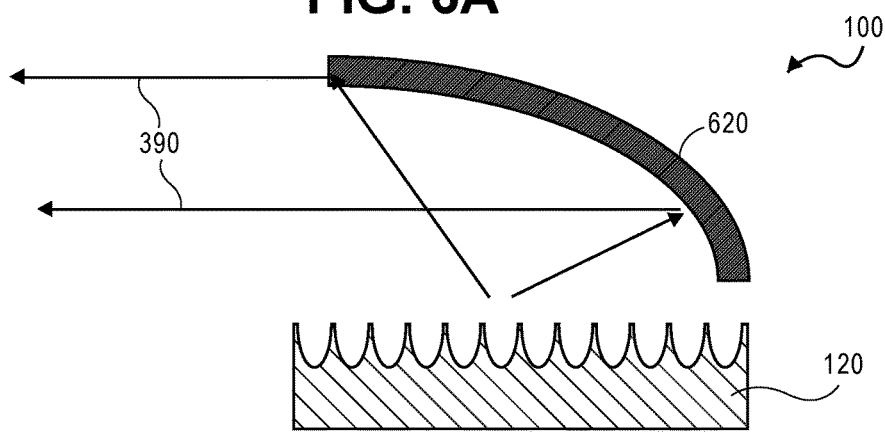
Figure 6C:
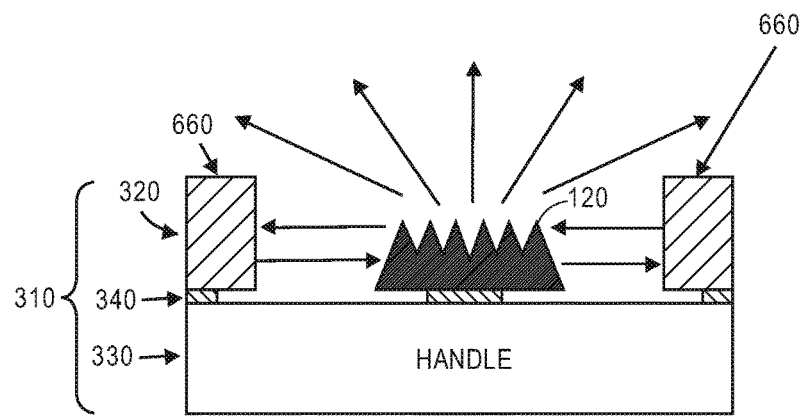
Figure 6D:
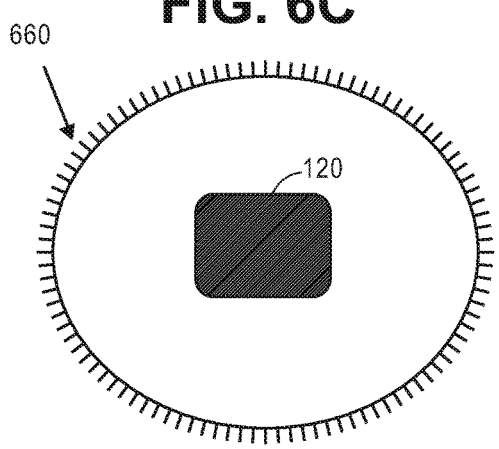
Figure 6E:
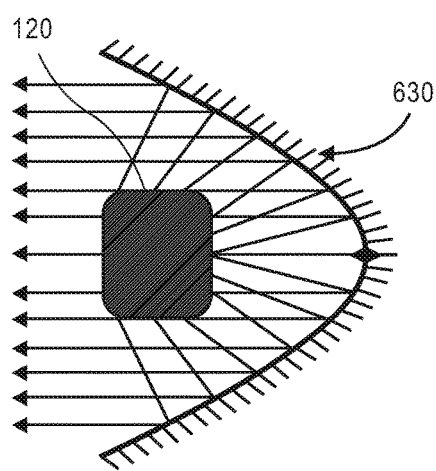

For example, as shown in FIG. 6A, the disordered semiconductor structure 120 may be enclosed in a hollow waveguide 610 to facilitate propagation of the emitted light 390 in the in-plane direction. As another example, as shown in FIG. 6B, the optical radiation source 100 may include a tilted or curved mirror 620 optically coupled to the disordered semiconductor structure 120 to receive the emitted light 390 and direct the emitted light 390 along a particular direction. In the example shown in FIG. 6B, the mirror 620 directs the emitted light in the in-plane direction. Referring now to FIGS. 6C and 6D, the direction of the thermal IR radiation may also be controlled by using metallic mirrors 660 surrounding the disordered semiconductor structure 120 to reflect the in-plane light rays back towards the disordered semiconductor structure 120 and allow out-of-plane light rays to exit the optical radiation source 100. In the example shown in FIG. 6C, the mirrors 660 may be fabricated in the device layer 320, such that their reflecting surfaces are perpendicular to the plane of the semiconductor substrate 310.

In some examples, collimation and focusing of the emitted light may be needed to make the best use of the emitted radiation and to increase the source to system coupling efficiency. For example, in interferometry-based applications, such as FTIR (Fourier Transform Infrared) spectrometers, collimation may be used to improve the diffraction-limited resolution, while focusing may be used to increase the signal to noise ratio. Collimation and focusing may be achieved by different components, such as curved mirrors and lenses in different configurations. In the example shown in FIG. 6E, collimation and focusing is performed using a parabolic mirror 630. The disordered semiconductor structure 120 is placed in the focal plane of the parabolic mirror 630 to reflect the emitted light rays parallel to the axis of the mirror 630. In some examples, the parabolic mirror 630 may be an in-plane 2D/3D curved mirror integrated in the same chip or an external mirror.

Figure 6F:
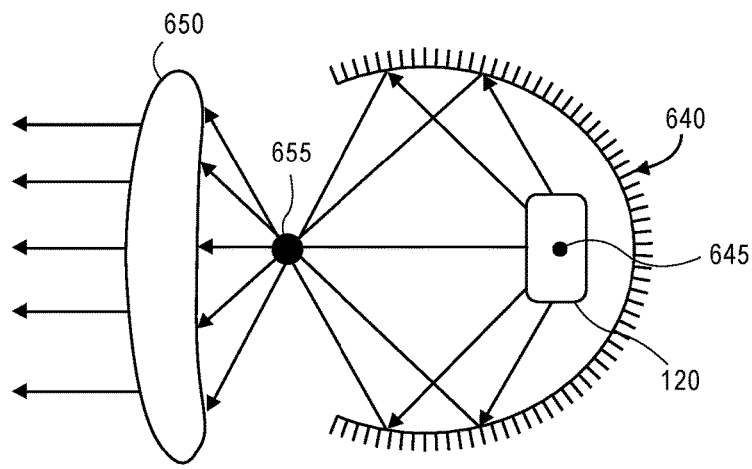

In the example shown in FIG. 6F, collimation and focusing is achieved using a combination of an elliptic mirror 640 and a lens 650. The disordered semiconductor structure 120 is placed in one of the focal points 645 of the mirror 640. In addition, the mirror 640 and lens 650 are spaced apart such that the other focal point of the mirror 640 is the same as the focal point 655 of the lens 650 to enable the emitted light rays to be focused by the mirror 640 and then collimated by the lens 650.

In some examples, the curved mirror 640 may be etched in the substrate below the disordered semiconductor structure 120 or fabricated on another substrate and then stacked with the substrate containing the disordered semiconductor structure. In addition, the lens 650 may be fabricated on silicon material by means of photoresist reflow, grayscale mask or lag effect in RIE. The lens 650 may further be Plano convex or positive meniscus, such that the reflected light rays from the lens 650 are focused again on the disordered semiconductor structure 120. In some examples, an optical system of two or more lenses may be used.

Figure 7A:
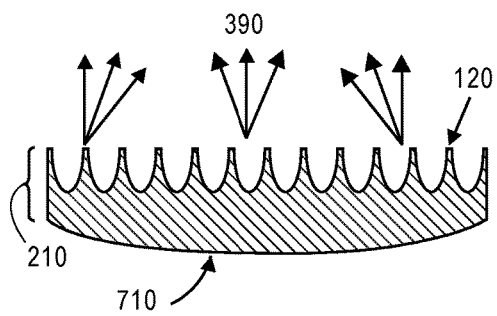
FIGS. 7A and 7B are schematic diagrams illustrating an exemplary configuration of the disordered semiconductor structure for controlling the directionality of the thermal infrared radiation, in accordance with embodiments of the present disclosure.
Figure 7B:
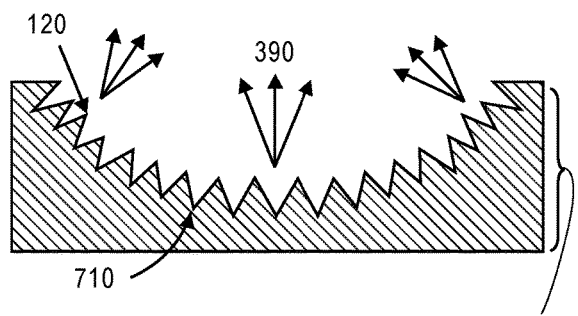

FIGS. 7A and 7B are schematic diagrams illustrating an exemplary configuration of the disordered semiconductor structure for controlling the directionality of the thermal infrared radiation, in accordance with embodiments of the present disclosure. As shown in FIGS. 7A and 7B, the directionality of the thermal IR radiation 390 may be controlled by fabricating a curved mirror 710 within the semiconductor substrate 210 on which the disordered semiconductor structure 120 is etched.

In the example shown in FIG. 7A, the curved mirror 710 includes a curved bottom surface of the semiconductor substrate 210, which may be fabricated, for example, using a three-dimensional fabrication method producing a concave or convex shape. The disordered semiconductor structure 120 may then be etched in a top surface of the semiconductor substrate 210. The resulting structure of FIG. 7A may control the thermal IR radiation from the top as well as from the bottom of the structure based on refraction and reflection properties.

In the example shown in FIG. 7B, the curved mirror 710 includes a curved top surface of the semiconductor substrate 210, which may be fabricated using any type of etching process. The disordered semiconductor structure 120 may then be etched within the curved mirror 710. In some examples, the semiconductor substrate 210 may be the device layer 320 or handle layer 330 of an SOI substrate 310, as shown in FIGS. 3A-3C.

FIGS. 8A and 8B are schematic diagrams illustrating another exemplary configuration of the disordered semiconductor structure 120 for controlling the directionality of the thermal infrared radiation, in accordance with embodiments of the present disclosure. In the example shown in FIGS. 8A and 8B, the directionality of the thermal IR radiation is controlled using the principles and refraction and diffraction, which is realized by utilizing concentric rings of silicon (or other semiconductor material) 810 and black silicon (or other disordered semiconductor material) 820 Error! Reference source not found. The realized structure has a Fresnel lens effect. In some examples, the shape of the rings may be elliptical or any other shape optimized for improving the directionality in a given direction. The performance may also be controlled by the spacing 830 between the rings and the etching depth of the black silicon (disordered semiconductor) material. In addition, the alternation between the silicon 810 and black silicon 820 may also enable emissivity engineering to control the emissivity value and profile versus the wavelength.

FIGS. 9A and 9B are schematic diagrams illustrating another exemplary configuration of the disordered semiconductor structure 120 for controlling the directionality of the thermal infrared radiation, in accordance with embodiments of the present disclosure. The spectral characteristics of the optical radiation source may be engineered by selectively doping the disordered semiconductor material, which may result in a plasmonic behavior in the infrared region, thus improving the emission in a certain wavelength and or direction. In the example shown in FIGS. 9A and 9B, selective doping of the semiconductor substrate 210 (e.g., the device layer 320 of the SOI substrate 310 shown in FIGS. 3A-3C) may be performed before etching of the disordered semiconductor structure. Thus, after etching, the disordered semiconductor structure 120 may include heavily doped regions 910 and lightly doped (or un-doped) regions 920. In some examples, the doping may be performed using a mask and ion implantation by either Boron, which can reach $3 \times 10^{20}$ cm$^{-3}$, or Phosphorous, which can reach $2 \times 10^{21}$ cm$^{-3}$ for a depth of about 100 nm in the semiconductor substrate. Longer depths (e.g., about 1 μm depth) may also be achieved by annealing. However, annealing the structure may reduce the doping level to about $10^{20}$ cm$^{-3}$.

In some examples, the heavily doped regions 910 may behave as a metal, thus inducing a diffraction grating effect with the emitted light enhanced in a given direction and wavelength. Instead of doping the semiconductor material, a similar result may also be achieved by depositing a periodic metallic structure (not shown) on top of the disordered semiconductor structure. In addition, plasmonic resonance due to the metallic structure may also be obtained.

FIG. 10 is a block diagram illustrating exemplary components of an optical radiation source 100 including a filter 1010 for controlling the thermal emission spectrum, in accordance with embodiments of the present disclosure. Thermal emission spectrum is typically wider than needed for certain applications. The unused emitted spectral energy decreases the efficiency of the optical radiation source. Thus, as shown in FIG. 10, the efficiency of the optical radiation source 100 may be improved by reflecting the energy of the unused spectral region back to the disordered semiconductor structure 120, where it may absorbed and contribute to heating.

In the example shown in FIG. 10, an electrical current (I) is applied to the heating element 110, which then generates heat directed towards the disordered semiconductor structure 120. According to the thermal mass network of the disordered semiconductor structure 120 and the ambient, the temperature (T) of the thermal emitter (disordered semiconductor structure 120) is set. Thus, the disordered semiconductor structure 120 radiates energy according to its temperature and emissivity. The emitted spectral energy may then be filtered by filter 1010, such that the useful band for a given application is transmitted to the output while the band that is not useful is reflected back to the disordered semiconductor structure 120. The reflected band energy (R) may then be translated to heat and temperature according to the absorptivity of the disordered semiconductor structure 120.

Figure 11:
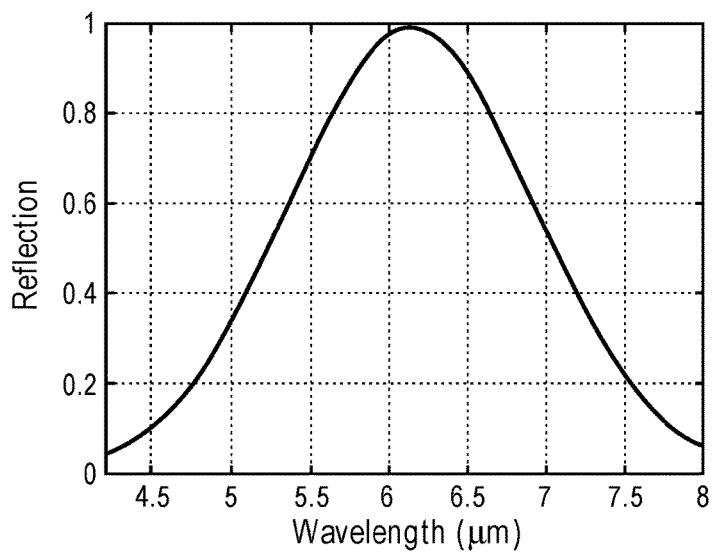
FIG. 11 illustrates an exemplary filter reflection response for a filter within the optical radiation source of FIG. 10, in accordance with embodiments of the present disclosure.
Figure 12:
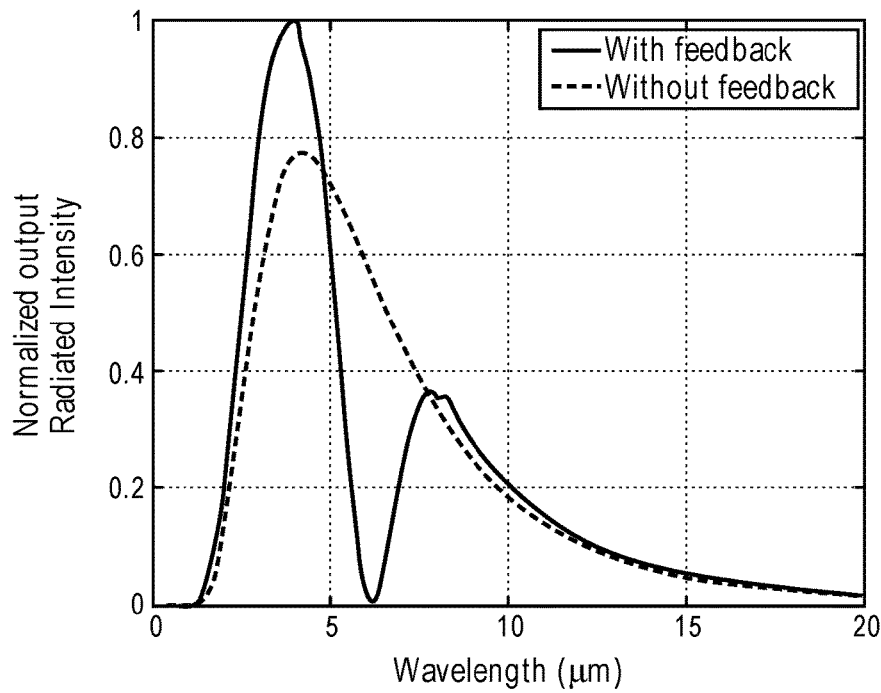
FIG. 12 illustrates exemplary thermal infrared radiation of an optical radiation source with and without a filter, in accordance with embodiments of the present disclosure.

An example of a filter response is shown in FIG. 11 that has a 2.2 μm/3 dB bandwidth to suppress/reflect the wavelengths within the filter response bandwidth from the output. The filtered/reflected wavelengths may then be fed back to the disordered semiconductor structure, which may then map the filtered/reflected energy to other wavelengths outside of the filter response. The resulting output radiation spectrum is shown in FIG. 12, which illustrates the radiated intensity verses wavelength with and without the feedback filter. As can be seen in FIG. 12, by using a feedback filter, the source temperature is higher and its radiation peak shifts to smaller wavelengths. In some examples, the emitted power may improved for wavelengths below about 5 μm.

Figure 13A:
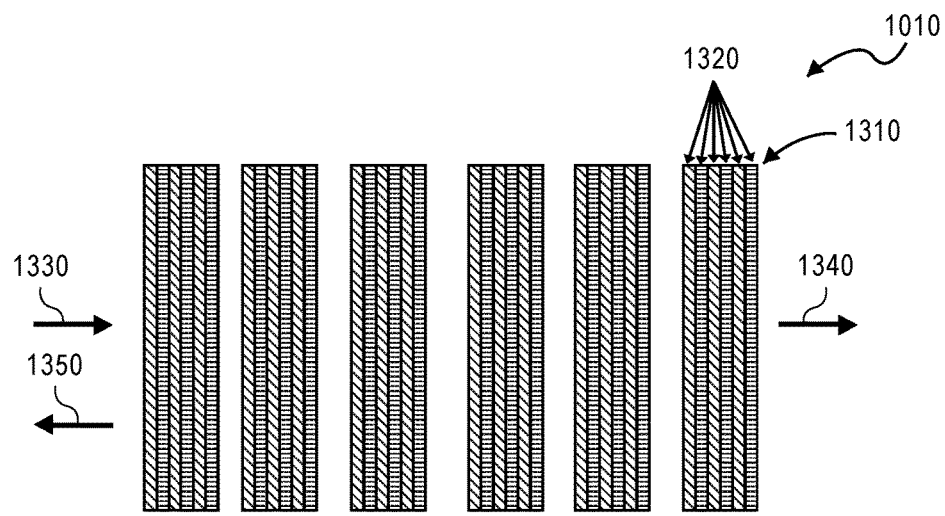
FIGS. 13A and 13B are schematic diagrams illustrating exemplary Bragg mirror filters for use in the optical radiation source of FIG. 10, in accordance with embodiments of the present disclosure.
Figure 13B:
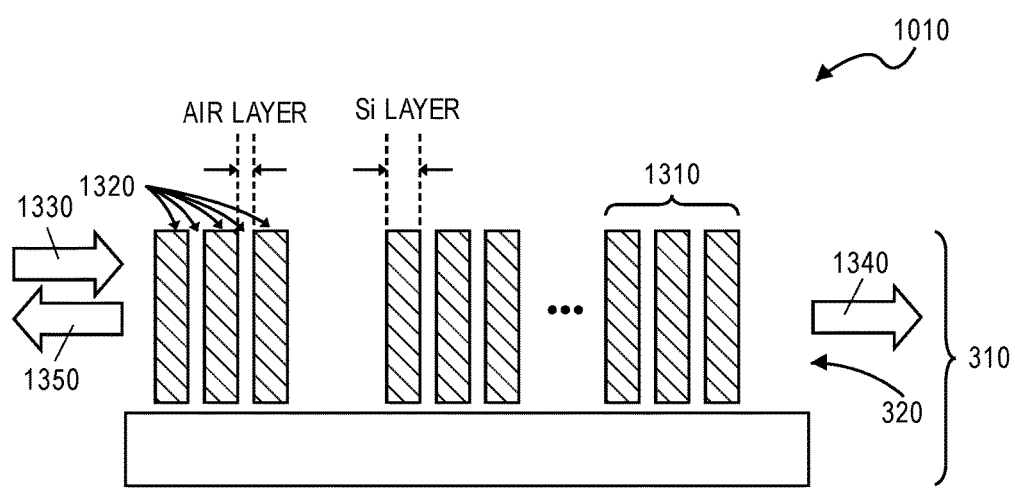

Referring now to FIGS. 13A and 13B, the wideband filter 1010 can be implemented using a plurality of cascaded Bragg mirrors 1310, each having a plurality of layers 1320. In the example shown in FIG. 13B, the layers 1320 alternate between air and silicon layers, and may be fabricated, for example, in the device layer 320 of an SOI substrate 310. However, in other examples, the layers 1320 may include other materials, such as metals and/or dielectric materials. The cascaded Bragg mirrors 1310 are oriented to receive incident light 1330 from the disordered semiconductor structure and filter the incident light 1330, such that part of the spectrum of the incident light is transmitted 1340 and the other part is reflected 1350.

Each Bragg mirror 1310 may have a limited reflection spectrum. Thus, the cascade of Bragg mirrors 1310 results in a wider reflection spectrum that can be used to feedback the reflection spectrum 1350 to the disordered semiconductor structure. In some examples, the dimensions of each of the layers 1320 in the Bragg mirrors 1310 may be controlled to shift the central wavelength of the reflection spectrum of each Bragg mirror 1310. The reflection spectrum of the Bragg mirrors 1310 may overlap or not, depending on the engineered output radiation (transmitted) spectrum 1340 needed from the optical radiation source. In addition, the Bragg mirrors 1310 may be oriented parallel or perpendicular to the surface of the substrate 310, the latter being illustrated in FIG. 13B.

FIGS. 14A and 14B are schematic diagrams illustrating an exemplary configuration of the optical radiation source 100 including a Bragg mirror filter 1010, in accordance with embodiments of the present disclosure. FIG. 14A is a side view, while FIG. 14B is a top view of the optical radiation source 100. The Bragg mirror filter 1010 may include, for example, a single Bragg mirror 1310 having a plurality of layers 1320 of alternating air and silicon. The layers 1320 may have different dimensions depending on the central wavelength of reflection required for the application.

In the example shown in FIGS. 14A and 14B, the thermal IR radiation 390 emitted from the disordered semiconductor structure 120 is in-plane with respect to the semiconductor (SOI) substrate 310. In this example, the disordered semiconductor structure 120 may be etched vertically in the substrate 310. The optical radiation source 100 may further include a parabolic metallic reflector 1410 for collimating and focusing the emitted thermal IR radiation towards the Bragg mirror filter 1010.

FIGS. 15A and 15B are schematic diagrams illustrating another exemplary configuration of the optical radiation source 100 including a Bragg mirror filter 1010, in accordance with embodiments of the present disclosure. FIG. 15A is a side view, while FIG. 15B is a top view of the optical radiation source 100. In the example shown in FIGS. 15A and 15B, the Bragg mirror filter 1010 surrounds the disordered semiconductor structure 120 and includes a single Bragg mirror 1310 on each side of the disordered semiconductor structure. The Bragg mirrors 1310 may overlap at the edges thereof to fully surround the disordered semiconductor structure 120. The dimensions of the Bragg layers 1320 of each of the Bragg mirrors 1320 may determine the allowed wavelengths (e.g., wavelengths transmitted through the Bragg mirror 1310) and the reflected wavelengths (e.g., wavelengths reflected back on the disordered semiconductor structure 120) for each of the Bragg mirrors 1310. In addition, the Bragg layers 1320 may have different thickness for different radiation angles around the disordered semiconductor structure 120. In some examples, the optical radiation source 100 may be a multi-wavelength source, and the Bragg mirror filter 1010 may selectively direct the different wavelengths (e.g., $\lambda_1$, $\lambda_2$, $\lambda_3$, and $\lambda_4$) to different directions in space.

Figure 16:
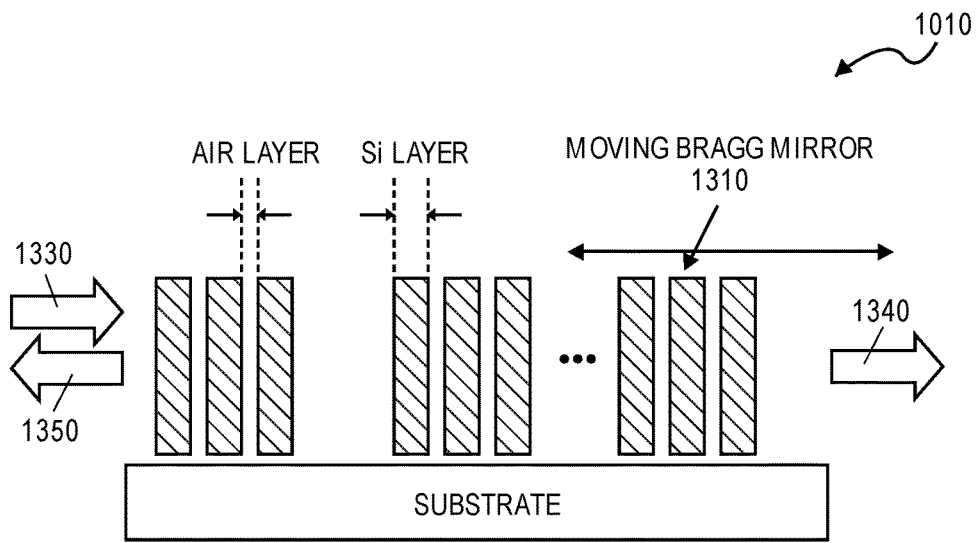
FIG. 16 is a schematic diagram illustrating an exemplary Bragg mirror filter configured to tune the optical radiation source, in accordance with embodiments of the present disclosure.

FIG. 16 is a schematic diagram illustrating an exemplary Bragg mirror filter 1010 configured to tune the optical radiation source, in accordance with embodiments of the present disclosure. In the example shown in FIG. 16, at least one of the Bragg mirrors 1310 in the Bragg mirror filter 1010 is moveable. For example, a Bragg mirror 1310 may be coupled to an actuator, such as a MEMS actuator, which, when actuated, may cause a displacement of the moveable Bragg mirror 1310 in order to vary the wavelengths of the transmitted/reflected spectrum 1340/1350.

In some examples, the transmission response of the filter 1010 may be much narrower than the original source spectrum, so that most of the incident power 1330 is reflected back on the disordered semiconductor structure. In this example, the reflected power 1350 will increase the temperature of the disordered semiconductor structure, allowing for much larger output power within the narrow transmission range of the filter 1010. As a result, the optical radiation source may have a larger coherence length with respect to conventional thermal sources.

The architecture shown in FIG. 16 can lead to a very wide tuning range, limited only by the tuning range capabilities of the filter 1010. In addition, the polarization may be controlled by adding a polarizer (not shown) before and/or after the filter 1010 and by designing the polarizer, such that unwanted polarizations are also reflected back to the disordered semiconductor structure, while desired polarizations are transmitted.

Figure 17:
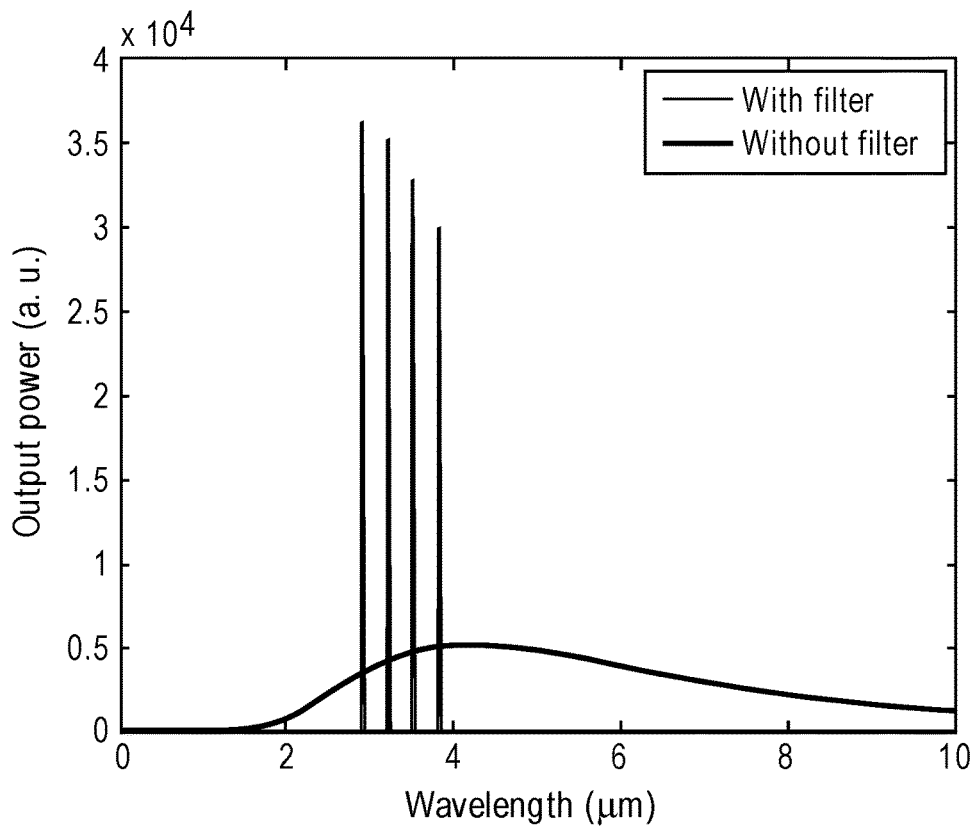
FIG. 17 illustrates an exemplary tunable output using a moveable Bragg mirror filter within the optical radiation source, in accordance with embodiments of the present disclosure.

Example output responses with and without tuning with a filter are shown in FIG. 17, where the relative values of the power are maintained. In the example shown in FIG. 17, tuning the filter towards longer wavelengths is accompanied with a slight reduction in the output power.

Figure 18A:
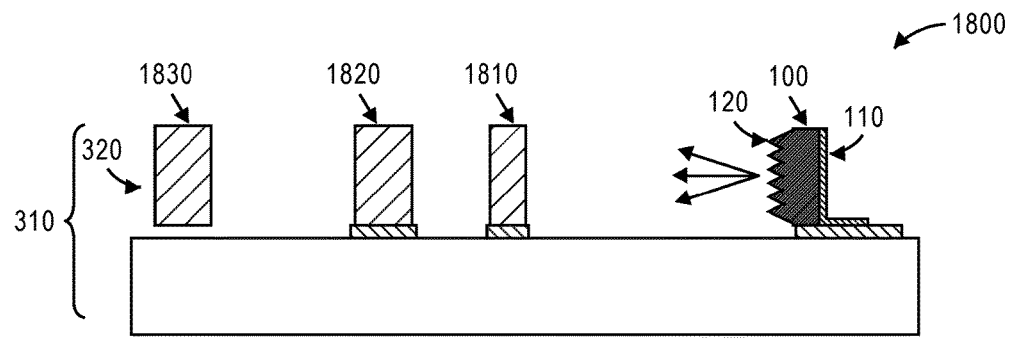
FIGS. 18A and 18B illustrate an exemplary microelectromechanical system (MEMS) optical interferometer including the optical radiation source, in accordance with embodiments of the present disclosure.
Figure 18B:
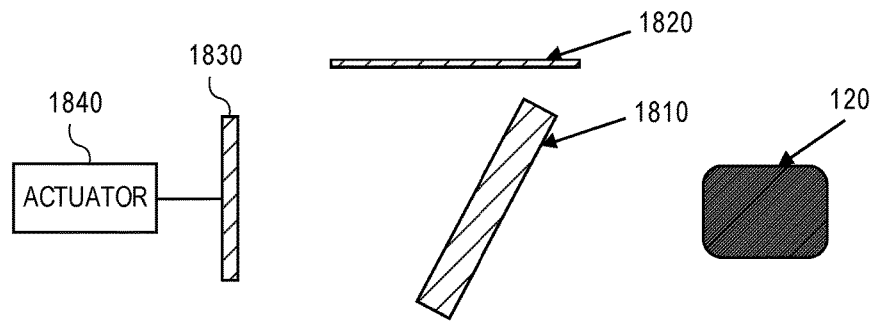

FIGS. 18A and 18B illustrate an exemplary microelectromechanical system (MEMS) optical interferometer 1800 including the optical radiation source 100, in accordance with embodiments of the present disclosure. FIG. 18A is a side view, while FIG. 18B is a top view of the MEMS optical interferometer 1800. The MEMS optical interferometer 1800 includes the optical radiation source 100 with the disordered semiconductor structure 120 and heating element 110, an optical beam splitter 1810, a fixed mirror 1820 and a moveable mirror 1830. In the example shown in FIG. 18A, each of the components of the MEMS optical interferometer 1800, including the optical radiation source 100, is fabricated on the same semiconductor (SOI) substrate 310 (e.g., within the device layer 320 of the SOI substrate 310). Thus, the alignment of the optical MEMS interferometer 1800 with the optical radiation source 100 may be achieved in a lithographic manner, and all of the components may be integrated monolithically.

In an exemplary operation, the input beam (e.g., the thermal IR radiation) emitted from the optical radiation source 100 is directed towards the beam splitter 1810. The beam splitter 1810 may be, for example, a silicon/air interface beam splitter positioned at an angle (e.g., 45 degrees) from the input beam to split the input beam into two beams, one propagating in air towards the fixed mirror 1820 and the other propagating in silicon towards the moving mirror 1830. The beam propagating in air originates from the partial reflection of the input beam from the silicon/air half plane beam splitter 1810, and thus has a reflection angle equal to the beam incidence angle. This beam propagates in air until reflected from the fixed mirror 1820, thus producing a first reflected beam.

In addition, the beam propagating in silicon originates from the partial transmission of the input beam through the silicon/air half plane beam splitter 1810 and propagates in silicon at an angle determined by Snell's law. This beam passes through the silicon and continues propagating until reflected by the moving mirror 1830, thus producing a second reflected beam. The two reflected beams propagate back towards the beam splitter 1810 and interfere, thus producing an interference pattern (interferogram) as an output signal that can be detected by a detector (not shown). In some examples, a Fourier Transform may then be applied to the detected interferogram by a processor (not shown) to retrieve the measured spectrum.

The moveable mirror 1830 is coupled to an actuator 1840 (e.g., a Micro-Electro-Mechanical Systems (MEMS) actuator), which causes a displacement of the moveable mirror to vary the optical path and create an optical path difference (OPD) between light beams propagating along the optical path. In an exemplary embodiment, the MEMS actuator may be an electrostatic actuator, such as a comb drive actuator, parallel plate actuator or other type of actuator.

Figure 19:
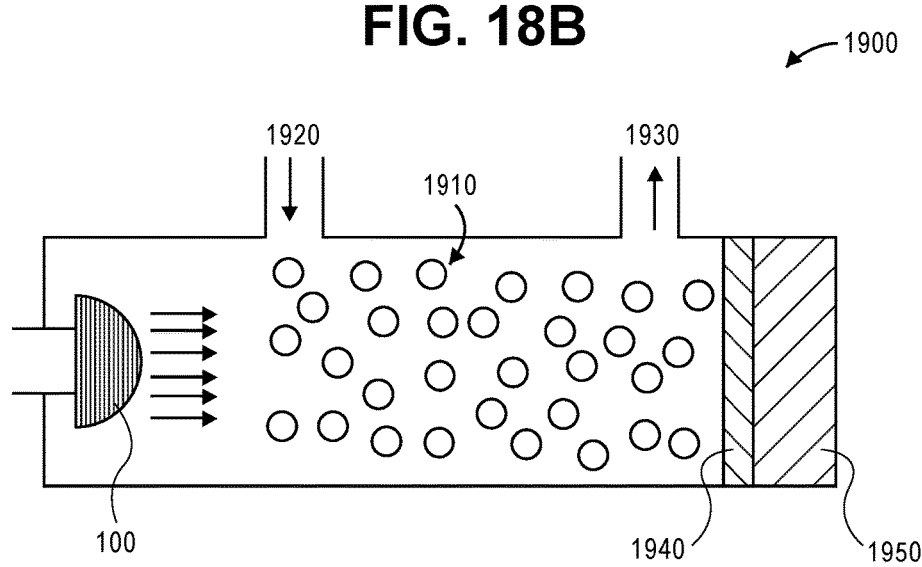
FIG. 19 illustrates an exemplary gas detection device including the optical radiation source, in accordance with embodiments of the present disclosure.

FIG. 19 illustrates an exemplary gas detection device 1900 including the optical radiation source 100, in accordance with embodiments of the present disclosure. The gas detection device 1900 includes the optical radiation source 100 with the disordered semiconductor structure, a gas cell 1910 with an inlet 1920 and an outlet 1930 for gas, an optical filter 1940 and a detector 1950. The gas cell 1910 contains the chemicals to be analyzed. In some examples, the optical radiation source 100 is a broadband source, optionally with a tunable central wavelength. In addition, the optical filter 1940 may be a tunable optical filter of narrow band, acting as a wavelength-scanning interferometer. Thus, different wavelength ranges may be accessible after multiple scans with a different central wavelength of the broadband optical radiation source 100.

In an exemplary operation, the light (e.g., thermal IR radiation) emitted from the optical radiation source 100 passes through the gas cell 1910 and the optical filter 1940 to the detector 1950. In some examples, the optical filter 1940 may be a scanning interferometer, as shown in FIGS. 18A and 18B. The light detected at the detector 1950 may then be input to a processor (not shown) for analysis.

The optical radiation source may be utilized in other applications as well, such as optical coherence tomography. For example, the optical radiation source may be combined with a scanner and a detector, all in the same package, leading to an ultra-compact OCT head.

Figure 20:
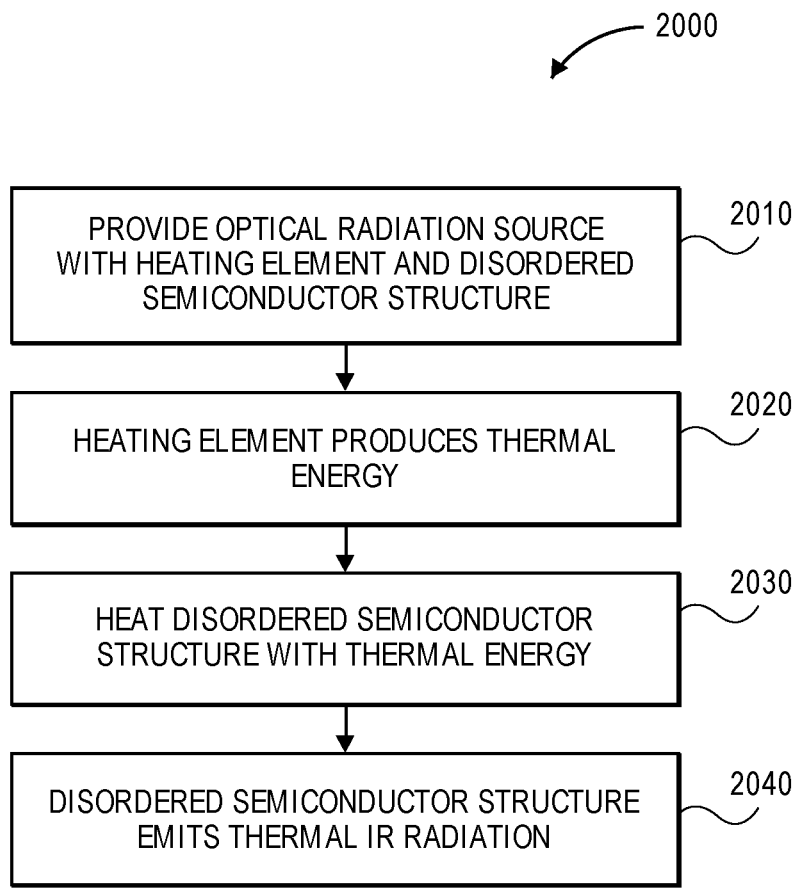
FIG. 20 is a flowchart illustrating an exemplary process for operating an optical radiation source, in accordance with embodiments of the present disclosure.

FIG. 20 is a flowchart illustrating an exemplary process for operating an optical radiation source, in accordance with embodiments of the present disclosure. The method 2000 shown in FIG. 20 may be implemented, for example, by the optical radiation source 100 shown in any of the above described Figures.

The method 2000 begins at block 2010 by providing an optical radiation source that includes a heating element and a disordered semiconductor structure in close proximity and in good thermal contact with the heating element. In some examples, the disordered semiconductor structure includes black silicon. At block 2020, the heating element of the optical radiation source accepts electrical energy input and transforms the input electrical energy into thermal energy. At block 2030, the heating element applies the thermal energy to the disordered semiconductor structure to heat the disordered semiconductor structure to a temperature at which the disordered semiconductor structure transforms the thermal energy into radiation energy and, at block 2040, the disordered semiconductor structure emits thermal infrared (IR) radiation (light).

Figure 21:
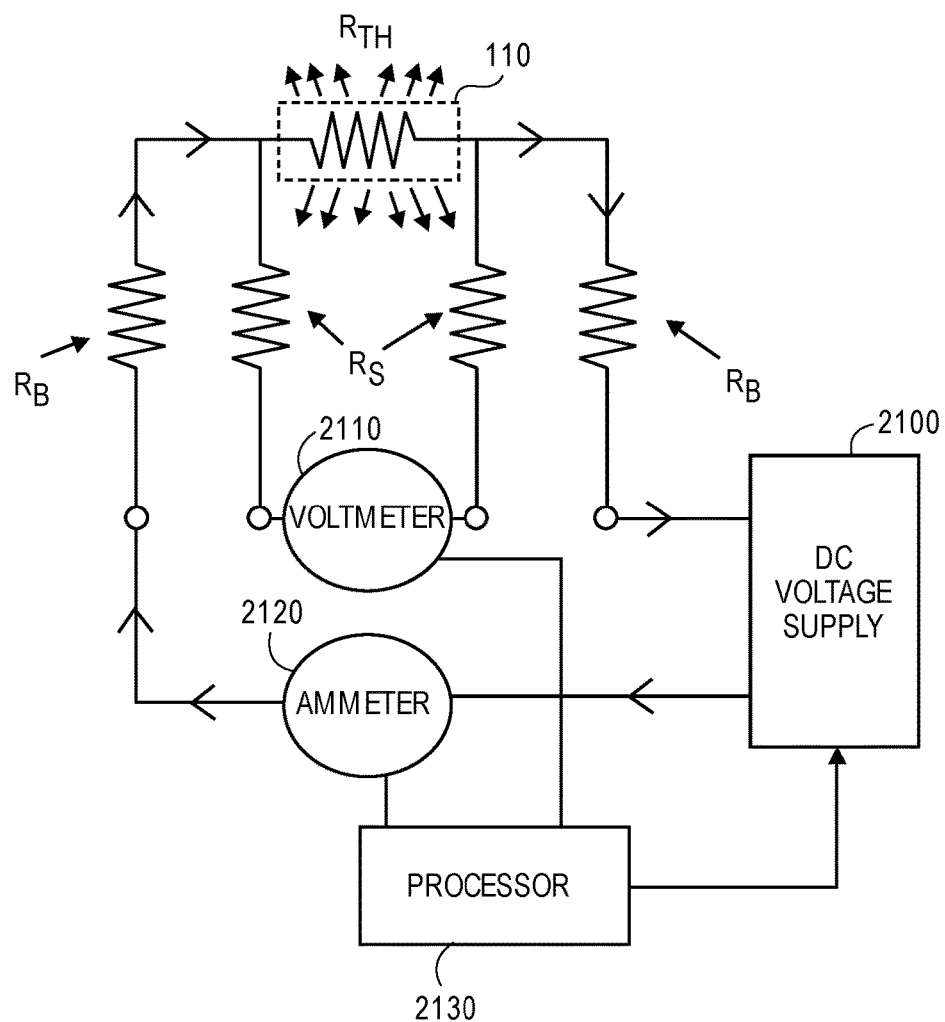
FIG. 21 illustrates accurate measuring of the heating element resistance using a four point probe method.

In order to provide stable output power and spectral response, as shown in FIG. 21, the temperature of the emitter (disordered semiconductor structure) may be stabilized using temperature sensing and feedback. For example, a voltage may be applied across the outer terminals of the heating element 110 by DC voltage supply 2100 causing the flow of the electric current, which increases the temperature of the heating element, thus producing the black body radiation. The temperature of the heating element may be extracted by measuring the variation of the heating element resistance ($R_{TH}$).

In some examples, the heating element includes platinum, which has good resistance stability, accuracy and also has a linear relation between its resistance and temperature. For example, the relationship between the resistance and the temperature higher than 0° C. may be given by:

$$R(T)=R(0)\times(1+A\times T) \quad \text{(Equation 3)}$$

where R(T) and R(0) are the thermal resistance at temperature T and 0° C., respectively, and A is the metal resistance temperature coefficient, which is known. The value of R(0) depends on the dimensions and the resistivity of the thin layer of metal.

Accurate measuring of the heating element resistance may obtained by using a four point probe method to eliminate the contact and arms resistances ($R_B$ and $R_S$), as shown in FIG. 21. The four point probe method uses a voltmeter 2110 and an ammeter 2120 connected to the heating element via electrical probes. The outputs of the voltmeter 2110 and ammeter 2120 may be provided to a processor 2130 to calculate the thermal resistance ($R_{TH}$) of the heating element by dividing the voltmeter reading by the ammeter reading V/I, thus eliminating the effect of the contact resistance and the arms resistances ($R_B$ and $R_S$). The temperature corresponding to the thermal resistance may then obtained by the processor 2130 using Equation 3 above. The temperature may then be compared by the processor 2130 to a reference value, and the result may be fed back to the DC voltage supply circuit 2100 driving the heating element 110 to increase the electrical power when the temperature is less than the reference value or decrease the electrical power when the temperature is larger than the reference value.

As will be recognized by those skilled in the art, the innovative concepts described in the present application can be modified and varied over a wide range of applications. Accordingly, the scope of patents subject matter should not be limited to any of the specific exemplary teachings discussed, but is instead defined by the following claims.

We claim:

1. An optical radiation source, comprising:
a semiconductor substrate;
a disordered semiconductor structure etched in the semiconductor substrate; and
a heating element disposed proximal to the disordered semiconductor structure and configured to heat the disordered semiconductor structure to a temperature at which the disordered semiconductor structure emits thermal infrared radiation.

2. The optical radiation source of claim 1, wherein the disordered semiconductor structure comprises a black silicon structure.

3. The optical radiation source of claim 2, wherein a surface of the black silicon structure is hyperdoped.

4. The optical radiation source of claim 2, wherein the black silicon structure includes a plurality of needles of single crystal silicon, the plurality of needles having an average height and an average width, an aspect ratio of the plurality of needles being equal to the average height divided by the average width.

5. The optical radiation source of claim 4, wherein the aspect ratio of the plurality of needles is greater than or equal to 5.

6. The optical radiation source of claim 4, wherein each of the plurality of needles has a shape corresponding to a spike, column, pyramid or cone.

7. The optical radiation source of claim 4, wherein a fill factor of the black silicon structure gradually increases from a head of the plurality of needles to a base of the plurality of needles.

8. The optical radiation source of claim 1, wherein the semiconductor substrate comprises a silicon-on-insulator (SOI) wafer, the SOI wafer comprising:
a device layer;
a handle layer; and
an insulator layer disposed between the device layer and the handle layer.

9. The optical radiation source of claim 8, wherein the disordered semiconductor structure is fabricated within the device layer.

10. The optical radiation source of claim 9, wherein the heater is disposed on the device layer.

11. The optical radiation source of claim 9, wherein the heater is disposed on the insulator layer within the handle layer.

12. The optical radiation source of claim 9, wherein the disordered semiconductor structure is thermally isolated on the device layer.

13. The optical radiation source of claim 8, wherein the insulator layer comprises buried oxide, glass or nitride.

14. The optical radiation source of claim 1, wherein the disordered semiconductor structure includes an array of emitters.

15. The optical radiation source of claim 1, wherein the disordered semiconductor structure is configured to emit the thermal IR radiation in-plane with the semiconductor substrate.

16. The optical radiation source of claim 1, wherein the disordered semiconductor structure is configured to emit the thermal IR radiation out-of-plane with the semiconductor substrate.

17. The optical radiation source of claim 1, wherein the heating element utilizes resistive heating and an electrical current travels in the heating element out-of-plane with the semiconductor substrate.

18. The optical radiation source of claim 1, further comprising:
an actuator coupled to the disordered semiconductor structure and configured to cause movement of the disordered semiconductor structure.

19. The optical radiation source of claim 1, further comprising:
a hollow waveguide enclosing the disordered semiconductor structure.

20. The optical radiation source of claim 1, further comprising:
at least one optical component optically coupled to the disordered semiconductor structure and configured to direct the thermal IR radiation emitted from the disordered semiconductor structure.

21. The optical radiation source of claim 20, wherein the optical component comprises a cylindrical mirror configured to reflect in-plane radiation from the disordered semiconductor structure back onto the disordered semiconductor structure for absorption and heating thereof.

22. The optical radiation source of claim 1, wherein:
the semiconductor substrate has a curved surface; and
the disordered semiconductor structure is fabricated in the curved surface.

23. The optical radiation source of claim 1, wherein the disordered semiconductor structure comprises concentric rings of alternating silicon and black silicon.

24. The optical radiation source of claim 1, further comprising:
a filter disposed on the semiconductor substrate and optically coupled to the disordered semiconductor structure, wherein the filter is configured to transmit a first portion of the thermal IR radiation and reflect a second portion of the thermal IR radiation back towards the disordered semiconductor structure for absorption and heating thereof.

25. The optical radiation source of claim 24, wherein the filter comprises a plurality of cascaded Bragg mirrors.

26. The optical radiation source of claim 25, wherein the filter is further configured to tune a central wavelength of the thermal IR radiation.

27. The optical radiation source of claim 1, wherein the disordered semiconductor structure comprises a plurality of doped regions configured to induce a diffraction grating effect of the thermal IR radiation.

28. The optical radiation source of claim 1, wherein the optical radiation source is monolithically integrated with a Micro Electro-Mechanical Systems (MEMS) optical interferometer on the semiconductor substrate and is configured to direct the thermal infrared radiation towards the MEMS optical interferometer.

29. The optical radiation source of claim 1, further comprising:
a circuit driving the heating element; and
a processor coupled to the circuit and configured to sense the temperature and provide a feedback signal to the circuit to stabilize the temperature.

* * * * *